(12) United States Patent  (10) Patent No.: US 7,435,114 B2
Desrosiers et al.  (45) Date of Patent: Oct. 14, 2008

(54) METHOD FOR DOCKING A PRINTED CIRCUIT BOARD

(75) Inventors: Norman Bruce Desrosiers, Oxford, NC (US); Dean Frederick Herring, Youngsville, NC (US); Paul Andrew Wormsbecher, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/035,544

(22) Filed: Feb. 22, 2008

(65) Prior Publication Data

US 2008/0153331 A1  Jun. 26, 2008

Related U.S. Application Data

(63) Continuation of application No. 11/614,550, filed on Dec. 21, 2006, now Pat. No. 7,364,447.

(51) Int. Cl.
*H01R 13/62* (2006.01)
(52) U.S. Cl. .................. 439/157; 439/159; 439/372
(58) Field of Classification Search .............. 439/157, 439/159, 372, 377; 361/798
See application file for complete search history.

(56) References Cited

U.S. PATENT DOCUMENTS

| | | | |
|---|---|---|---|
| 5,149,276 A | 9/1992 | Dixon | |
| 5,368,493 A | 11/1994 | O'Brien et al. | |
| 5,389,001 A | 2/1995 | Broschard, III et al. | |
| 5,470,241 A | 11/1995 | Kaufman et al. | |
| 5,967,824 A | 10/1999 | Neal et al. | |
| 6,288,911 B1 | 9/2001 | Aoki et al. | |
| 6,315,586 B1 | 11/2001 | Joyce et al. | |
| 6,667,890 B1 | 12/2003 | Barringer et al. | |
| 6,709,276 B2 | 3/2004 | Barringer et al. | |
| 6,816,383 B2 | 11/2004 | Barringer et al. | |
| 6,930,892 B2 | 8/2005 | Barringer et al. | |

*Primary Examiner*—Hae Moon Hyeon
(74) *Attorney, Agent, or Firm*—Cynthia Byrd; Jeffrey L. Streets

(57) ABSTRACT

An apparatus to align and dock or undock a first electronic circuit board with a first connector with a second electronic circuit board with a second connector. The apparatus comprises a guide plate with a linkage to connect to a mounting plate. The first electronic circuit board is secured to the mounting plate. The guide plate is inserted into a chassis comprising a guide to receive the guide plate. The guide aligns the first connector to be received in the second connector. The linkage is actuated by displacing a positioning handle. The linkage translates the motion in a direction generally perpendicular to the direction of displacement of the positioning handle. The mounting plate is translated in the generally perpendicular direction, and the first connector is received into the second connector. The operation may be reversed to remove the first connector from the second connector.

10 Claims, 4 Drawing Sheets

METHOD FOR DOCKING A PRINTED CIRCUIT BOARD

CROSS-REFERENCE TO RELATED APPLICATIONS

This application is a continuation of U.S. patent application Ser. No. 11/614,550 filed on Dec. 21, 2006.

BACKGROUND OF THE INVENTION

1. Field of the Invention

The present invention relates to printed circuit board installation in electronic devices. More specifically, the invention provides an apparatus for accurately docking a printed circuit board in a constrained space.

2. Description of the Related Art

Swappable components have become commonplace in computer systems. Computer systems often use swappable memory, hard drives, and various pieces of hardware commonly referred to as daughter cards. Many maintenance, repair, or upgrade operations may involve the removal of a piece of hardware, or the insertion of a piece of hardware, or both while the computer is on and functioning.

In a server rack, or chassis, many computer components are stored in close proximity. Often, these racks have numerous electronic circuit boards. The electronic circuit boards may be aligned in banks, both above or below, or beside each other. The electronic circuit boards may provide memory for the system, or perform specific other operations within the computer system.

Conventionally, the changing of an electronic circuit board may be accomplished by removing a cover, removing the prior electronic circuit board by lift it out of a header, and docking a new electronic circuit board by inserting it straight into the header. However, computer components are often installed in configurations making it difficult to achieve the mechanical advantage to accurately and carefully dock an electronic circuit board. If the docking or undocking of an electronic circuit board is needed where space is a concern, it may necessitate the removal of one or more electronic circuit boards from the neighboring slots. This procedure might then require the entire system to be shut down.

It is fairly common for computer systems to be continually operational. Therefore, installation, removal, or replacement of components is preferably accomplished via hot-swapping without disturbing the operation of adjacent circuit boards. This necessarily means that users are manipulating components of an electrically energized system. It would be desirable to have a means of inserting or removing an electronic circuit board without risk of damage to either the user or the component.

Printed circuit boards, such as daughter cards, can become damaged during insertion into a connector or header due to an uneven application of force or misalignment of the daughter card with the connector slot. It is ideal if the card is carefully position above and parallel to the connector, then pressed slowly and firmly straight toward the connector until a successful connection has been made. Haste and inaccessibility are just two of many factors that can prevent the ideal connection from ever occurring.

Therefore, there is a need for a device that facilitates safe, effective and simple insertion and removal of electronic circuit boards, even in very tight spaces.

SUMMARY OF THE INVENTION

The present invention provides an apparatus comprising: a guide plate selectively securable in a position adjacent a first electronic connector; a mounting plate positioned generally parallel to the guide plate, wherein the mounting plate is vertically slidably secured to the guide plate; a mechanical linkage coupled between the guide plate and the mounting plate; and an electronic circuit board fixedly coupled to the mounting plate, the electronic circuit board having a second electronic connector selectively mateable with the first electronic connector, wherein actuation of the mechanical linkage causes the mounting plate and circuit board to move vertically over a distance sufficient to insert and remove the second electronic connector relative to the first electronic connector.

In one embodiment, the invention provides a method comprising: securing a first electronic circuit board with a first connector on a mounting plate linked to a guide plate; inserting the guide plate into a chassis comprising a second electronic circuit board with a second connector; aligning the first connector with the second connector; applying a force generally parallel to the direction of insertion of the guide plate into the chassis; translating the force to a direction generally perpendicular to the direction of insertion of the guide plate into the chassis; displacing the mounting plate in a direction generally perpendicular to the direction of insertion of the guide plate into the chassis; and receiving the first connector in the second connector or, alternatively, removing the first connector from the second connector.

The foregoing and other objects, features and advantages of the invention will be apparent from the following more particular description of a preferred embodiment of the invention, as illustrated in accompanying drawings wherein like reference numbers represent like parts of the invention.

DETAILED DESCRIPTION OF THE INVENTION

Figure 1:
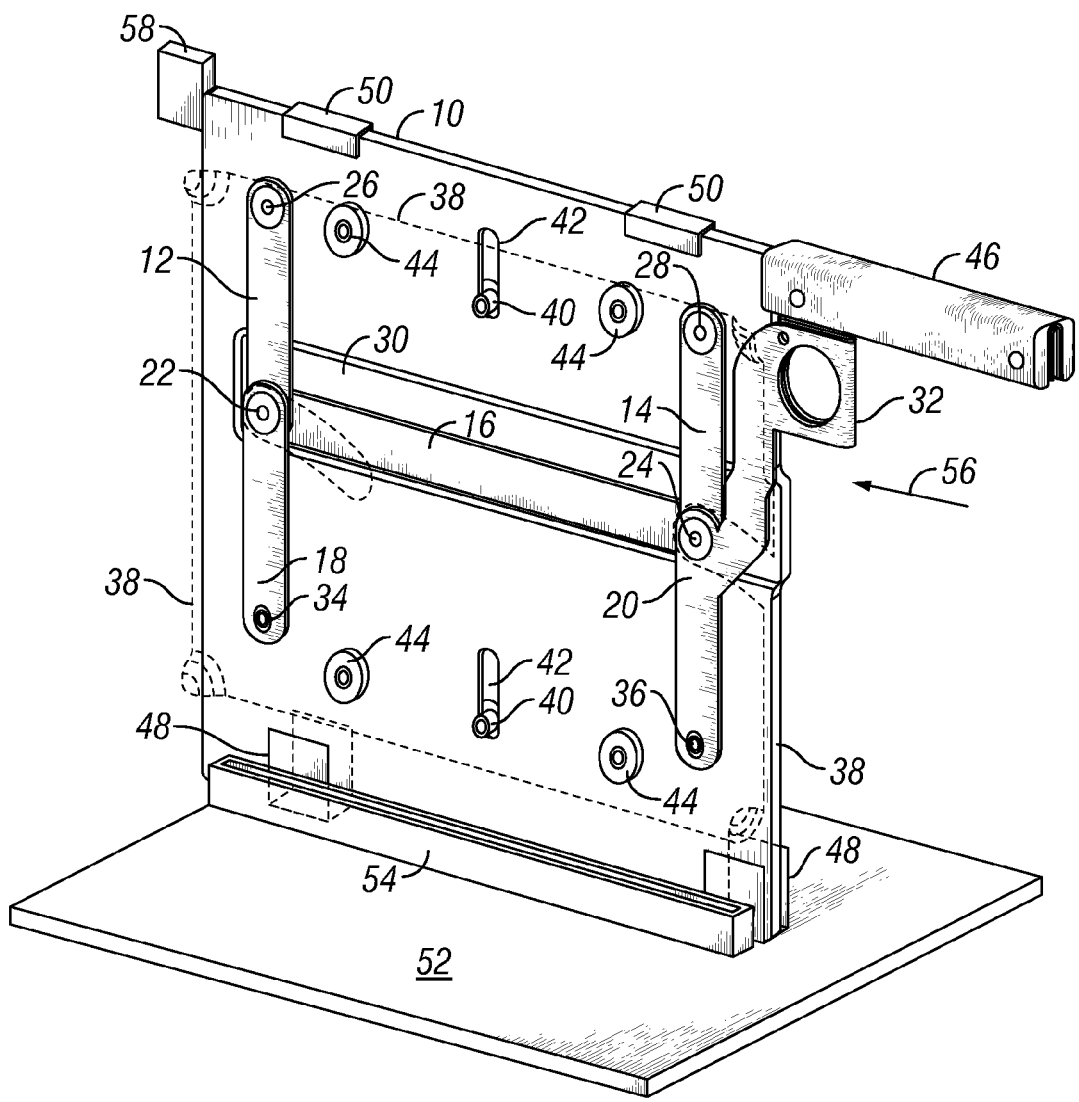
FIGS. 1 and 2 are perspective side views a guide plate and mounting plate coupled by a parallelogram linkage with the mounting plate in a down position and up position, respectively.

FIG. 1 is a perspective view of a guide plate 10 and a parallelogram linkage in accordance with one embodiment of the invention. The parallelogram linkage is comprised of a plurality of pivot arms 12, 14, a link arm 16, and two positioning arms 18, 20. The arms are pivotally coupled to each other at the pivot junctions 22, 24 and pivotally coupled to the guide plate 10 at the pivot couplings 26, 28. The arms are preferably made of a rigid material, such as metal, to maintain its rigidity in both tension and compression.

The link arm 16 is of a sufficient length to maintain the pivot arms 12, 14, which have the same length, in a generally parallel configuration. Since the arms cannot all lie in the same plane at the pivot junctions 22, 24, the guide plate 10 may include an indented region 30 to accommodate the link arm 16 behind the pivot arms 12, 14. The positioning arms 18, 20 are shown in front of the pivot arms 12, 14 so that the positioning arms are a spaced a short distance (approximately equal to the thickness of the pivot arms 12, 14) from the guide plate 10. The parallelogram linkage may further comprise a positioning handle 32 that forms part of the positioning arm 20 and is used to actuate the linkage, as will be discussed in more detail in reference to FIG. 2.

The positioning arms 18, 20 have an equal distance between the pivot junctions 22, 24 and the pivotal couplings 34, 36 that secure and support a mounting plate 38 (shown as translucent for purposes of illustration). While the mounting plate 38 receives vertical support from the pivotal couplings 34, 36 to the positioning arms 18, 20, the mounting plate 38 is laterally constrained by a pair of pins 40 that extend from the mounting plate through a pair of vertical slots 42 in the guide plate 10. While one slot and pin might be sufficient, the use of two or more parallel, vertical slots 42 and pins 40 is preferable. The slots 42 should run in a direction that a daughter card should be installed into a connector.

The mounting plate, or optionally the guide plate, may further comprise one or more sliders 44 to serve as low friction spacers and stabilize the motion of the mounting plate in a plane generally parallel to the plane of the guide plate. The slider 24 may be a protrusion on the mounting plate or guide plate to contact the guide plate or mounting plate, respectively. The slider may be a small tab of plastic, or any other material that can maintain the uniform standoff between the guide plate and the mounting plate, without restricting or interfering with the motion of the mounting plate. Still further, the guide plate 10 may also include a handle 46 to facilitate handling of the entire assembly without touching the daughter card (not shown). The handle may optionally be made of or protected by a non-conducting material, such as rubber, to protect the user from accidental electrical shock.

As shown in FIG. 1, the guide plate 10 has been slidingly inserted (preferably in the direction of arrow 56) between a lower guide or guides 48 secured to a motherboard 52 and an upper guide or guides 50 secured to a chassis member (not shown). Alternatively, both upper and lower guides may be secured to a chassis member, so long as the daughter card can be connected to and communication with the connector 54. In either instance, the leading edge of the guide plate 10 should engage a stop 58 at the point where the guide plate is properly aligned for inserting the daughter card directly into the connector 54. The stop 58 may be secured to the chassis (not shown) or could be positioned at the lower edge of the guide plate and be formed as part of the connector 54 itself in order to further avoid alignment errors.

Figure 2:
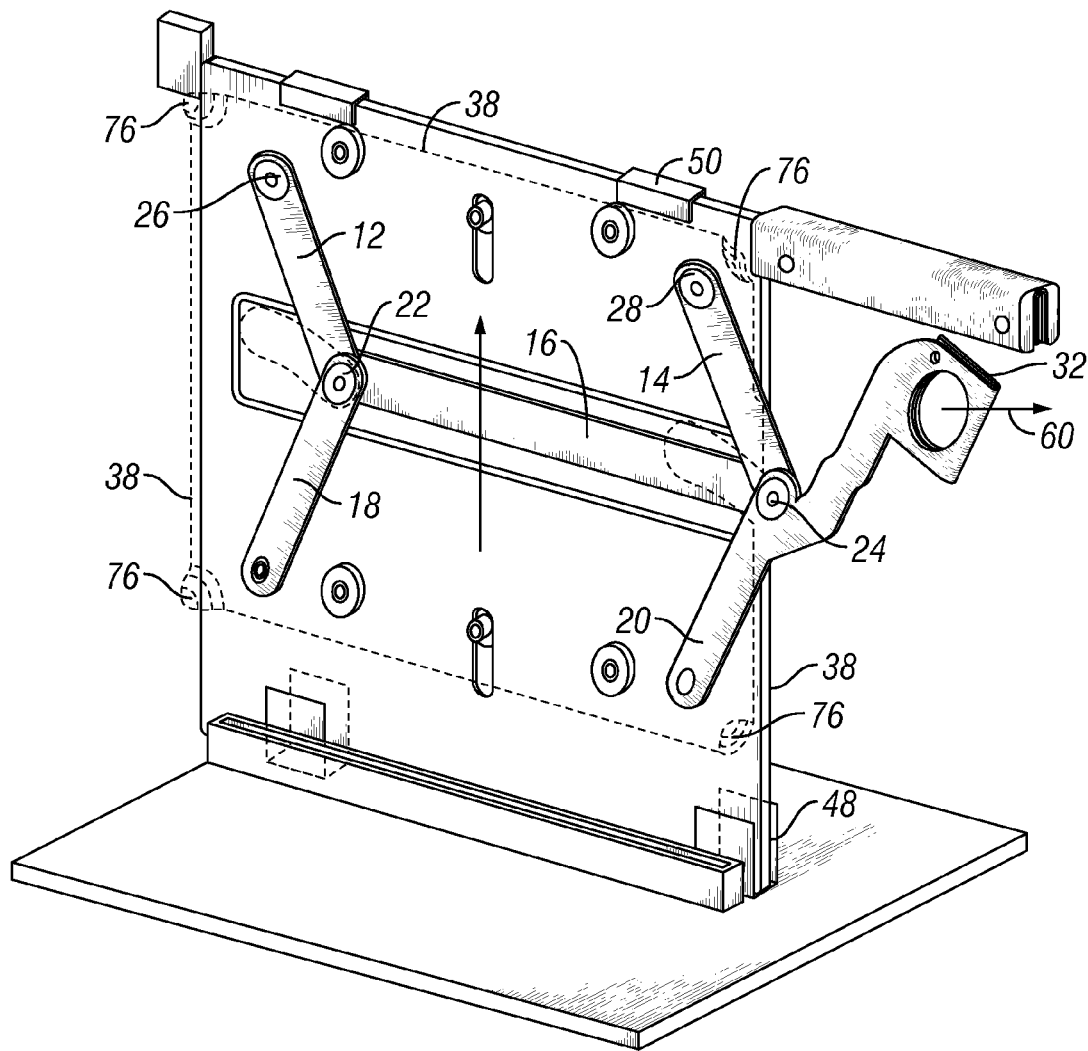

FIG. 2 is a perspective view of the guide plate 10 and the parallelogram linkage of FIG. 1 when actuated. The positioning handle 32, which forms part of positioning arm 20, has been pulled laterally away from the guide plate 10 (in the direction of arrow 60). The link arm 16 and link junctions 222, 24 are displaced in the same direction relative to the guide plate 10 (in the direction of arrow 60). The pivot arms 12, 14 cause an upward displacement in the link arm 16 and link junctions 22, 24, because they are pivotally coupled to the guide plate 10 at couplings 26, 28. The upward displacement of the link arm 16 results in the upward displacement of the plate positioning arms 18, 20 relative to the guide plate 10. Then, because the plate positioning arms 18, 20 are pivotally coupled to the mounting plate 38 at couplings 34, 36, the mounting plate itself is drawn upward relative to the guide plate. As previously explained, the mounting plate pins 40 extend through guide plate slots 42 in order to limit the mounting plate to a generally straight path, such as a vertical path. The pins preferably terminate in a head that prevents the pin from pulling through the slot.

It should be recognized that alternating movement of the positioning handle 32 in the direction of arrow 60 and in the direction of arrow 56 will cause the mounting plate to move between an "up" position and a "down" position, respectively. Furthermore, this up and down movement occurs without any lateral movement of the guide plate or the mounting plate. In this manner, a daughter card mounted to the mounting plate may be carefully and accurately inserted into and removed from the connector 54 by actuation of the positioning handle 32.

Figure 3:
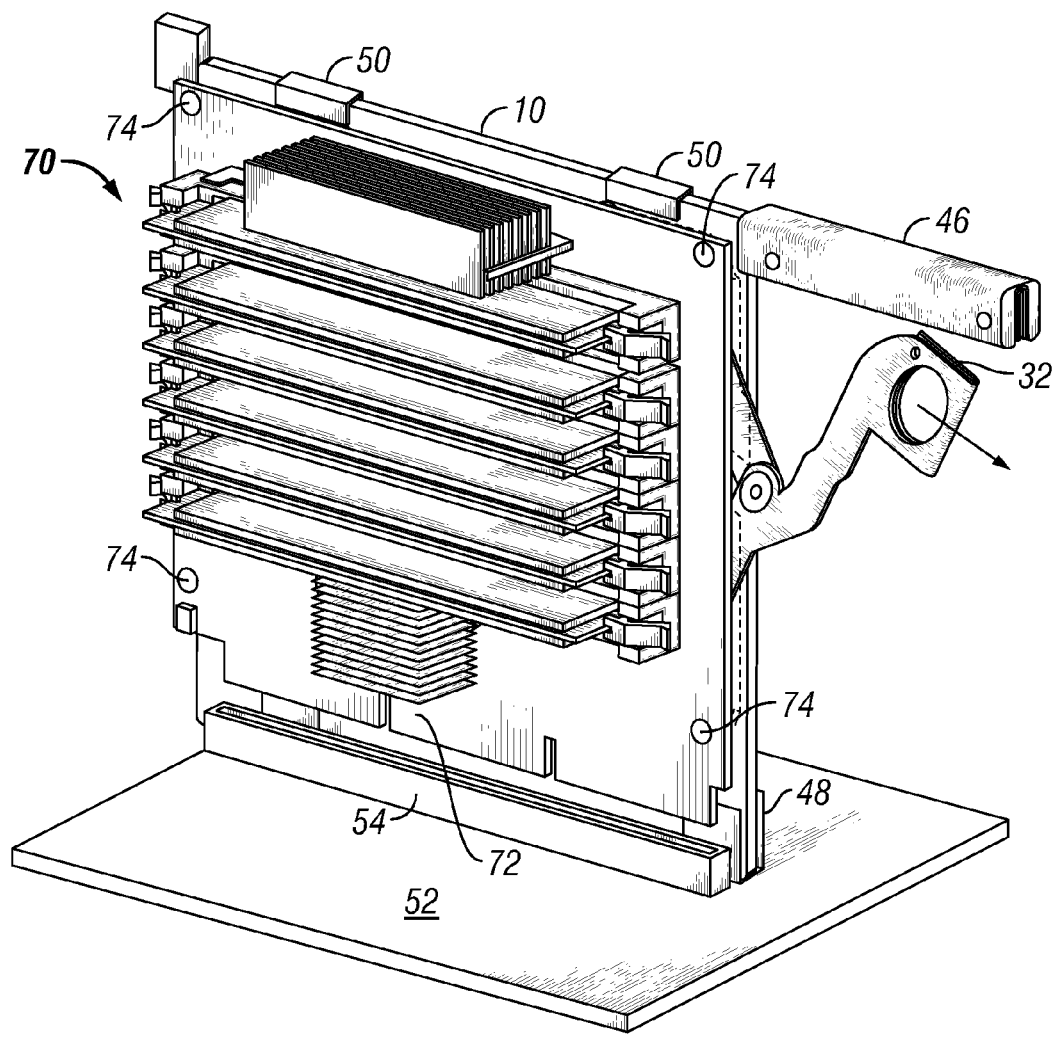
FIG. 3 is a perspective view of a daughter card secured to the mounting plate and securing in the up position with the daughter card connector aligned with a second connector.

FIG. 3 is a perspective view of a first electronic circuit board, or daughter card 70 secured to the mounting plate 38 at the corners by screws 74 that couple with the mounts 76 (See FIG. 2). The daughter card 70 may have numerous functional structures, including a first connector 72 shown at the bottom edge of the daughter card 70. In this figure, the positioning handle 32 is shown laterally displaced, and the daughter card 70 in the "up" position as described in FIG. 2.

Figure 4:
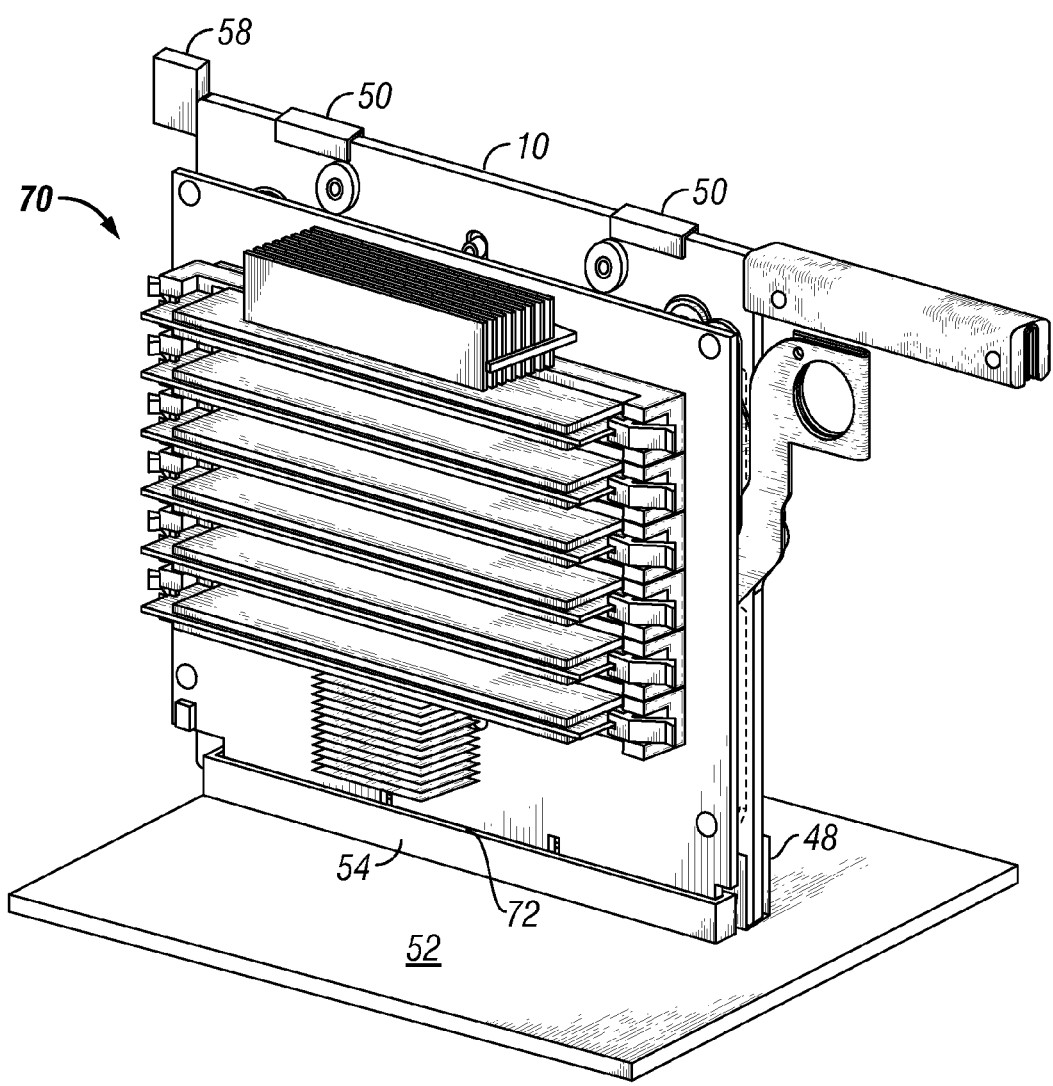
FIG. 4 is a perspective view of a daughter card secured to the mounting plate and securing in the down position with the daughter card connector inserted into the second connector.

FIG. 4 is a perspective view of the apparatus of FIG. 3, with the daughter card in the "down" position. With the guide plate 10 fully inserted into guides 48, 50 and against the stop 58, and the positioning handle 32 laterally retracted (as in FIG. 1), the daughter card 70 is now in the "down" position where the first connector 72 is received by the second connector 54.

Accordingly, the present invention further comprises a method of safely docking or undocking a first electronic circuit board with a first connector with a second electronic circuit board with a second connector to receive the first connector. Initially the first electronic circuit board, comprising a first connector is secured to a mounting plate linked to a guide plate. The first electronic circuit board may be screwed on, clipped on, or secured in any manner that ensures it will move in unison with the mounting plate. The first electronic circuit board may be removably secured, or permanently secured.

The guide plate is inserted into a chassis comprising guides. The guides may receive the guide plate on a rail, in a groove, in a bay, or any other means which allows the chassis to receive the guide plate. The first connector is aligned with a second connector on a second electronic circuit board within the chassis. This may be accomplished by the guides restricting the motion of the guide plate when inserted, manually, with a sensor, or any other method which indicates that the first connector and second connector are aligned.

A force generally parallel to the direction of insertion of the guide plate into the chassis is applied. This force may be applied by a user with a handle, a motor, or any means which causes a force to be applied. The force is translated in a direction generally perpendicular to the direction of application. This translation may be accomplished by mechanical means, such as through the use of a parallelogram linkage, and slots to constrain the motion of the guide plate or mounting plate.

The translated force is applied to the mounting plate. The mounting plate is displaced in a direction generally perpendicular to the direction of insertion of the guide plate into the chassis. The first electronic circuit board secured to the mounting plate moves in unison with the mounting plate. The first connector is then received into the second connector or, alternatively, removed from the second connector.

The terms "comprising," "including," and "having," as used in the claims and specification herein, shall be considered as indicating an open group that may include other elements not specified. The terms "a," "an," and the singular forms of words shall be taken to include the plural form of the same words, such that the terms mean that one or more of something is provided. The term "one" or "single" may be used to indicate that one and only one of something is intended. Similarly, other specific integer values, such as "two," may be used when a specific number of things is intended. The terms "preferably," "preferred," "prefer," "optionally," "may," and similar terms are used to indicate that an item, condition or step being referred to is an optional (not required) feature of the invention.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

The invention claimed is:

1. A method of docking an electronic circuit board comprising:
   securing a first electronic circuit board with a first connector on a mounting plate linked to a guide plate;
   inserting the guide plate into a chassis comprising a second electronic circuit board with a second connector;
   aligning the first connector with the second connector;
   applying a force to a mechanical linkage coupled between the guide plate and the mounting plate in a direction generally parallel to the direction of insertion of the guide plate into the chassis;
   translating the force generally parallel to the direction of insertion using the mechanical linkage to displace the mounting plate in a direction generally perpendicular to the direction of insertion of the guide plate into the chassis; and
   receiving the first connector in the second connector or, alternatively, removing the first connector from the second connector.

2. The method of claim 1, wherein the mechanical linkage comprises a parallelogram linkage.

3. The method of claim 2, wherein the mechanical linkage comprises a pair of parallel pivot arms having a first end pivotally coupled to the guide plate, a link arm pivotally coupled to a second end of the pivot arms, a pair of parallel positioning arms, and a positioning handle coupled to a pivot arm, the link arm, or a positioning arm, wherein each positioning arm has a first end pivotally coupled to the link arm and a second end pivotally coupled to the mounting plate.

4. The method of claim 1, further comprising:
   stabilizing the motion of the mounting plate in a plane generally parallel to the plane of the guide plate.

5. The method of claim 4, wherein the motion of the mounting plate is stabilized with a low friction spacer.

6. The method of claim 1, further comprising:
   laterally constraining the mounting plate with a pin that extends from the mounting plate through a vertical slot in the guide plate.

7. The method of claim 1, wherein the step of inserting the guide plate into a chassis includes slidably inserting the guide plate in upper and lower guide channels secured to the chassis in a position to transversely align the first and second connectors.

8. The method of claim 1, further comprising:
   limiting the insertion of the guide plate with a stop member disposed to axially align the first and second connectors.

9. The method of claim 8, wherein the stop member is secured to the chassis.

10. The method of claim 8, wherein the stop member is formed as part of the second connector.

* * * * *